(12) United States Patent
Reilly

(10) Patent No.: US 8,868,584 B2
(45) Date of Patent: Oct. 21, 2014

(54) COMPRESSION PATTERN MATCHING

(75) Inventor: John J. Reilly, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 13/350,016

(22) Filed: Jan. 13, 2012

(65) Prior Publication Data

US 2013/0185319 A1    Jul. 18, 2013

(51) Int. Cl.
*G06F 17/30* (2006.01)

(52) U.S. Cl.
USPC ............................ 707/758; 707/747; 707/791

(58) Field of Classification Search
CPC .................... G06F 17/30985; G06F 17/30949; G06F 17/30097; G06F 9/4436; H04L 45/7457
USPC .......................................... 707/758, 747, 791
See application file for complete search history.

(56) References Cited

U.S. PATENT DOCUMENTS

| | | | |
|---|---|---|---|
| 5,140,321 A | 8/1992 | Jung | |
| 5,229,768 A | 7/1993 | Thomas | |
| 5,281,967 A * | 1/1994 | Jung | 341/55 |
| 5,406,278 A | 4/1995 | Graybill et al. | |
| 5,506,580 A * | 4/1996 | Whiting et al. | 341/51 |
| 7,403,136 B2 * | 7/2008 | De La Cruz et al. | 341/51 |
| 7,469,243 B2 | 12/2008 | Mori et al. | |
| 7,982,636 B2 | 7/2011 | Abali et al. | |
| 2004/0049493 A1 * | 3/2004 | Davis | 707/3 |
| 2006/0193159 A1 * | 8/2006 | Tan et al. | 365/49 |

FOREIGN PATENT DOCUMENTS

JP         2000201081        7/2000

\* cited by examiner

*Primary Examiner* — Thanh-Ha Dang
(74) *Attorney, Agent, or Firm* — Michael Le Strange; Roberts Mlotkowski Safran & Cole, P.C.

(57) ABSTRACT

Systems and methods are provided for data comparisons in a compression algorithm to optimize the compression of data. An exemplary method includes receiving input data. The method further includes generating a hash table address for the input data. The method further includes obtaining a pointer associated with the hash table address. The method further includes reading a data library with the pointer to obtain an associated piece of historical data. The method further includes comparing the historical data to the input data to determine a match.

20 Claims, 5 Drawing Sheets

COMPRESSION PATTERN MATCHING

FIELD OF THE INVENTION

The invention relates to systems and methods for pattern matching and, more particularly, to systems and methods for data comparisons in a compression algorithm to optimize the compression of data.

BACKGROUND

Pattern matching is the application of analytical rules to a block of data to identify a feature of that block of data. Data compression in networks, which transmit data between computer systems, often involves transmitting data using an encoding scheme or compression algorithm that utilizes pattern matching to compress the data and reduce the amount of bandwidth and receiver buffer space necessary for transmission of the data. For example, a Lempel-Ziv Stac algorithm is an example a data compression encoding scheme that utilizes pattern matching.

The Lempel-Ziv Stac algorithm searches an incoming data stream for repeating data patterns by comparing the incoming data intended for transmission to a history buffer, or dictionary, maintained at a transmitter side of the link. Repetitive data patterns are replaced by a token of shorter length; this token usually consists of a pointer to the repetitive data's matching location in the history buffer and a length of the matching data sequence.

For example, the transmitter might maintain a history of the past 1 Kbyte of data frames, and whenever a new data sequence is input to the compressor, this history may be searched for matching data sequences. Instead of transmitting the actual data, a token might be generated which effectively states, "go back 150 bytes in the history and transmit the next 10 bytes." At the receiver side of the link, a decompressor recreates an exact replica of the compressor's dictionary and uses the tokens provided by the data stream to invert the compression operation.

Therefore, the tokens can be viewed as pointers into the 1 Kbyte data history. The history files at both ends of the link should match; otherwise, the decompressor pointer token will output meaningless data. Thus, future data is compressed based on the previous data history. Typical compression ratios vary with the type of data and amount of redundancy present. Completely random data will not be compressed very much at all, while highly redundant traffic with a lot of idle characters may experience a very large improvement. Data compression efficiency thus depends on the pattern matching.

Accordingly, there exists a need in the art to overcome the deficiencies and limitations described hereinabove.

SUMMARY

In a first aspect of the invention, a method comprises receiving input data. The method further comprises generating a hash table address for the input data. The method further comprises obtaining a pointer associated with the hash table address. The method further comprises reading a data library with the pointer to obtain an associated piece of historical data. The method further comprises comparing the historical data to the input data to determine a match.

In another aspect of the invention, a method is provided comprising receiving input data of a first data size, which comprises a plurality of subpieces. The method further comprises generating a hash table comprising a hash table address for the input data. The method further comprises writing the input data to a buffer. The method further comprising receiving subsequent input data of a second size. The method further comprises comparing the subsequent input data to the plurality of subpieces of the input data and all historical data in the buffer to find a match.

In yet another aspect of the invention, a computer program product is provided comprising a computer usable storage memory having readable program code embodied in the storage memory. The computer program product includes at least one component operable to receive "n" number of input words. The at least one component is further operable to use a hash function to obtain a hash table address for each of the "n" number of input words. The at least one component is further operable to retrieve "n" number of FIFO addresses referenced by each hash table address for each of the "n" number of input words. The at least one component is further operable to retrieve "n" number of FIFO words referenced by each of the "n" number of FIFO addresses. The at least one component is further operable to compare each of the "n" number of input words with the "n" number of FIFO words.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

Figure 1:
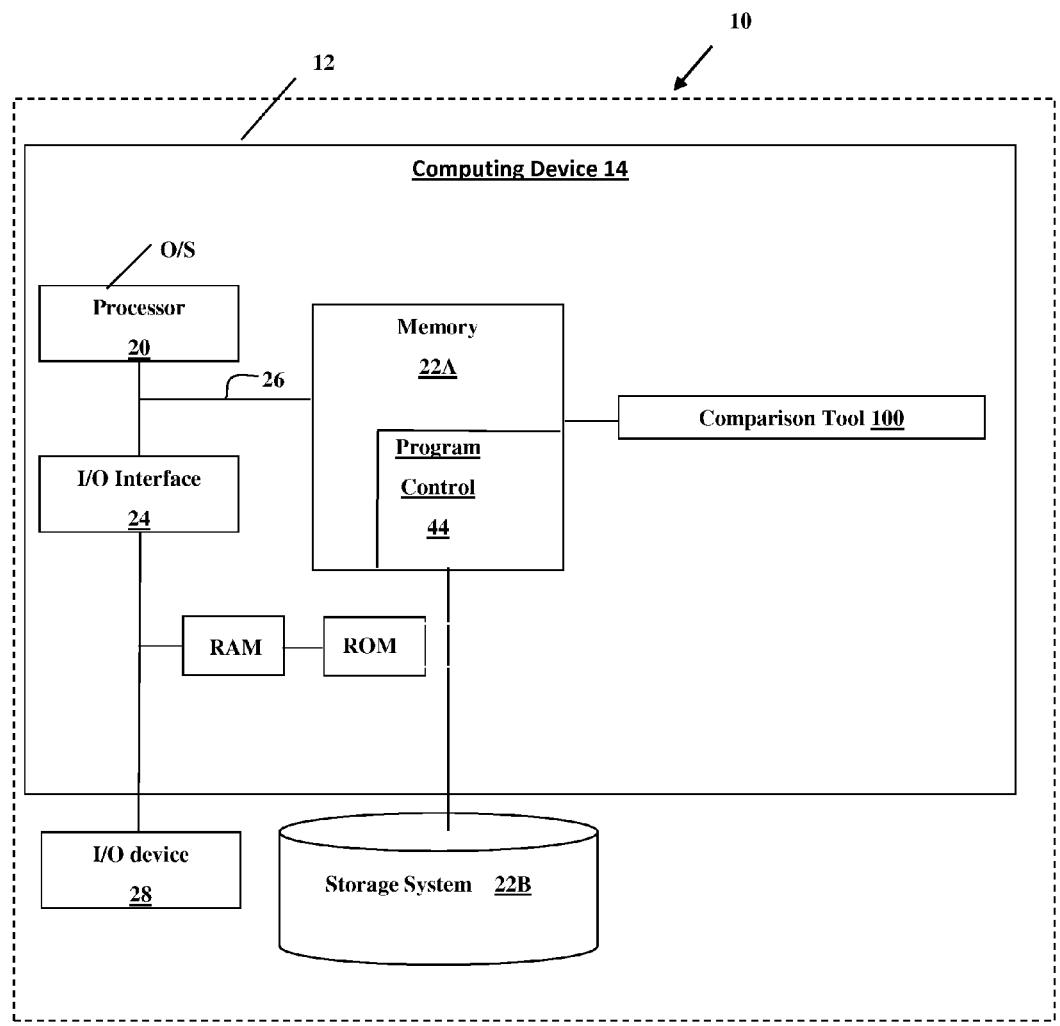
FIG. 1 is an illustrative external environment for implementing the invention in accordance with aspects of the invention.

The invention relates to systems and methods for pattern matching and, more particularly, to systems and methods for data comparisons in a compression algorithm to optimize the compression of data. The compression algorithm used in embodiments of the invention replaces an input phrase with a pointer. Since each phrase gives a single potential pointer to check, only one comparison is required at a minimum. However, by performing more data comparisons using additional data from the data history and their associated pointers, the chance of a match increases.

More specifically, implementations of the invention provide systems and methods for doubleword comparisons in pattern matching to optimize the compression of data. For example, in embodiments, (i) a hash table may be generated with pointers that reference a corresponding doubleword, e.g., a 64 bit data in a data history, (ii) input halfwords, e.g., 16 bit input data may be compared with each halfword within the referenced doubleword, and (iii) an appropriate pointer may be determined based on the halfword matching with a halfword within the doubleword.

Additionally, implementations of the invention provide systems and methods for all to all comparisons in pattern matching to optimize the compression of data. For example in alternative embodiments, (i) a hash table may be created with pointers that reference a corresponding doubleword, e.g., a 64 bit data in a data history, (ii) input halfwords, e.g., 16 bit input data, may be compared with all of the halfwords within all referenced doublewords, even those from other input halfwords, and (iii) an appropriate pointer may be determined based on the input halfword matching with any halfword within all referenced doublewords in the data history.

Advantageously, in embodiments, the systems and methods for data comparisons in a compression algorithm using additional halfwords and/or doublewords in the data history and their associated pointers allows the chances of a pattern matching to increase. In addition, advantageously, in embodiments, the systems and methods for data comparisons in a compression algorithm by using additional halfwords and/or doublewords in the data history and their associated pointers allows for the optimization of data compression.

In additional embodiments, systems and methods for data comparisons in a communication system using a compression algorithm are provided. The systems and methods may comprise an input port, a hash table, a first-in-first-out (FIFO) data array, and an output port. The input port receives "n" number of input words, each input word being "x" bits long. A hash function is used to obtain a hash table address for each of the "n" number of input words. The hash table subsequently retrieves "n" number of FIFO addresses referenced by each hash table address for each of the "n" number of input words. The FIFO data array then retrieves "n" number of FIFO words referenced by each of the "n" number of FIFO addresses. Each FIFO word of the "n" number of FIFO words may be comprised of "z" number of subwords. Each subword of the "z" number of subwords may be "x" bits long. Each of the "n" number of input words is then compared with all of the "z" number of subwords comprised within the "n" number of FIFO words. The output port returning each of the corresponding FIFO addresses for each match between the input words and the FIFO words.

Embodiments of the invention are described herein with reference to specific examples of sizes of data, e.g., 64 bit doublewords and 16 bit halfwords, for illustrative purposes. However, one of ordinary skill in the art of pattern matching and data compression would recognize that the disclosed systems and methods are not limited to these sizes of data and may be implement using many different variations of data sizes.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer usable storage memory can be any physical storage device such as random access memory (RAM) or a read-only memory (ROM) to name a few examples.

Program code embodied on a computer readable medium may be transmitted using any appropriate medium, including but not limited to wireless, wireline, optical fiber cable, RF, etc., or any suitable combination of the foregoing.

Computer program instructions may also be stored in the computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code should be retrieved from bulk storage during execution. In addition, the computing device includes RAM, ROM, and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls an comparison tool 100 to perform the processes described herein. The comparison tool 100 can be implemented as one or more program code in the program control 44 stored in memory 22A as separate or combined modules. Additionally, the comparison tool 100 may be implemented as separate dedicated processors or a single or several processors to provide the function of this tool. While executing the computer program code, the processor 20 can read and/or write data to/from memory 22A, storage system 22B, and/or I/O interface 24. The program code executes the processes of the invention. The bus 26 provides a communications link between each of the components in the computing device 14.

In embodiments, the comparison tool 100 can determine data comparisons in a compression algorithm and optimize the compression of data. For example, in accordance with aspects of the invention, the comparison tool 100 can generate a hash table with pointers that reference a piece of input data, create a data library of received input data, receive input data and compare new input data to previously received input data in the data library, and determine an appropriate pointer for matching input data.

Figure 2A:
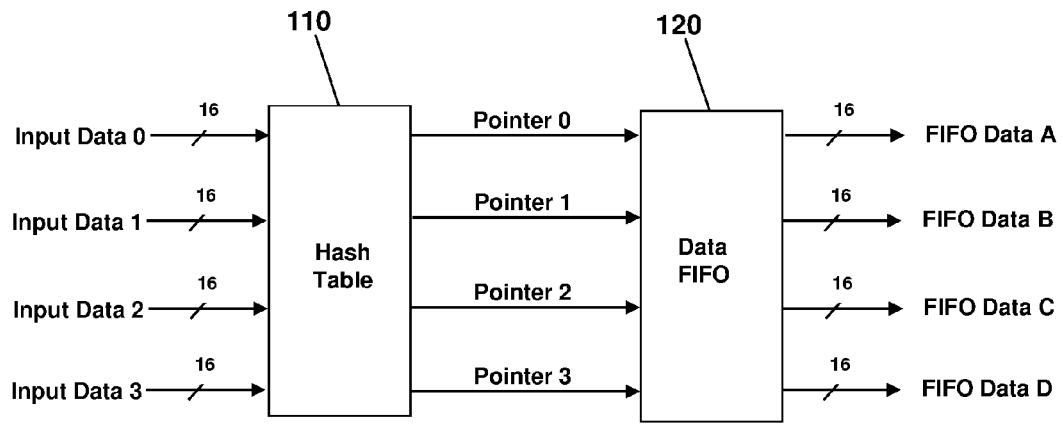
FIG. 2a is an illustration that shows an exemplary single comparison.
Figure 2A:
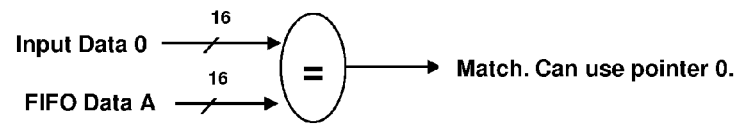
Figure 2A:
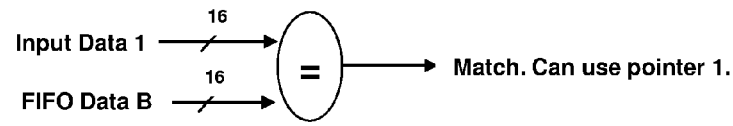
Figure 2A:
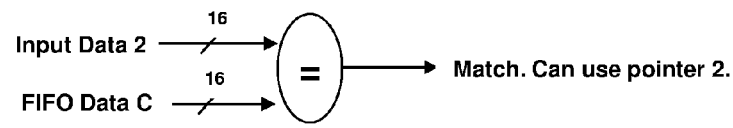
Figure 2A:
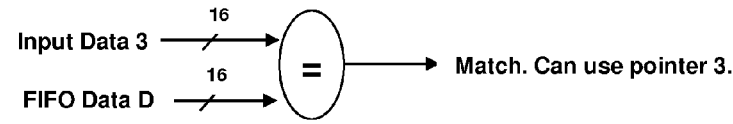
Figure 2B:
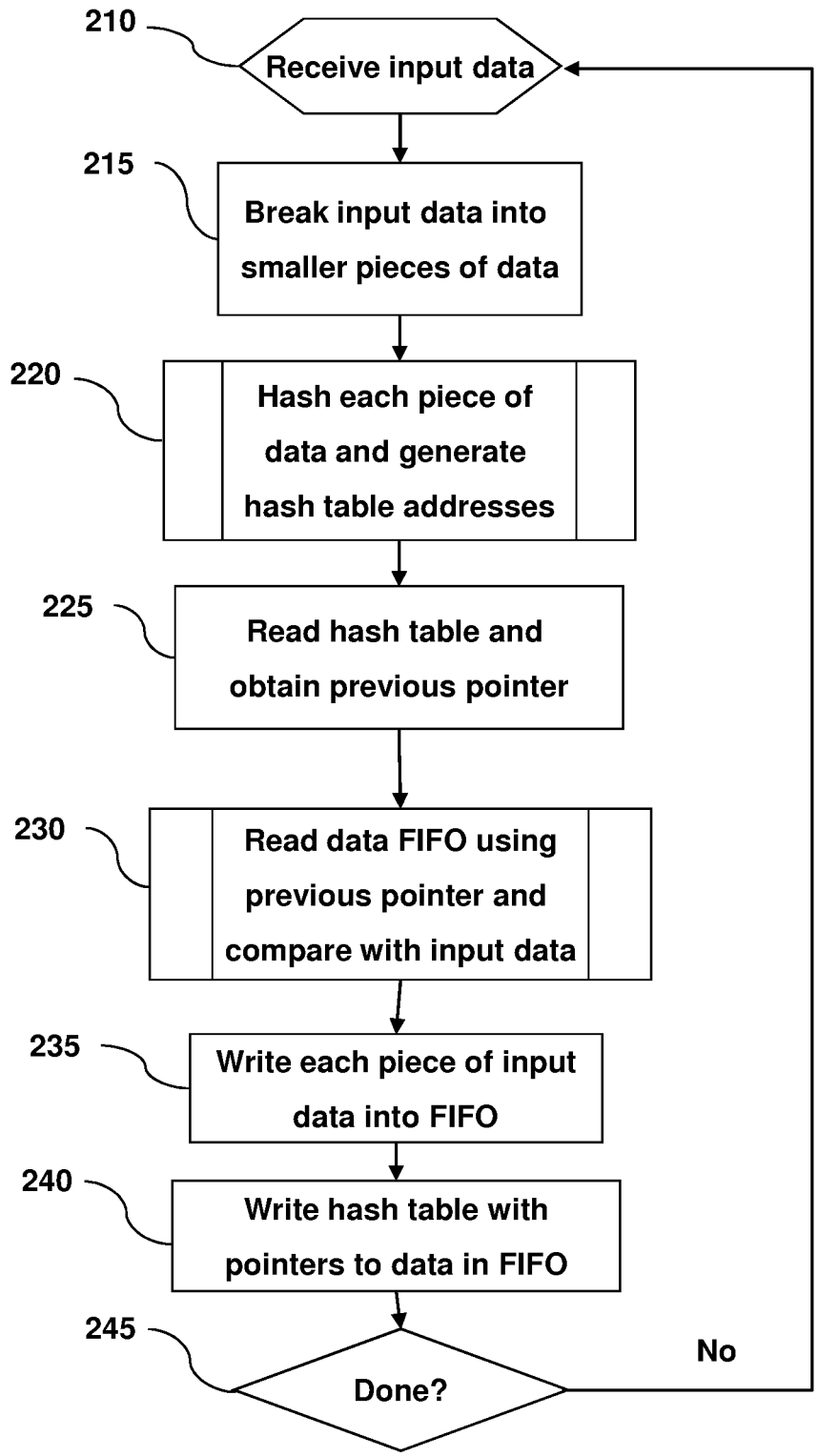
FIG. 2b is an illustrative process flow of implementing the system in accordance with aspects of the invention.
Figure 3:
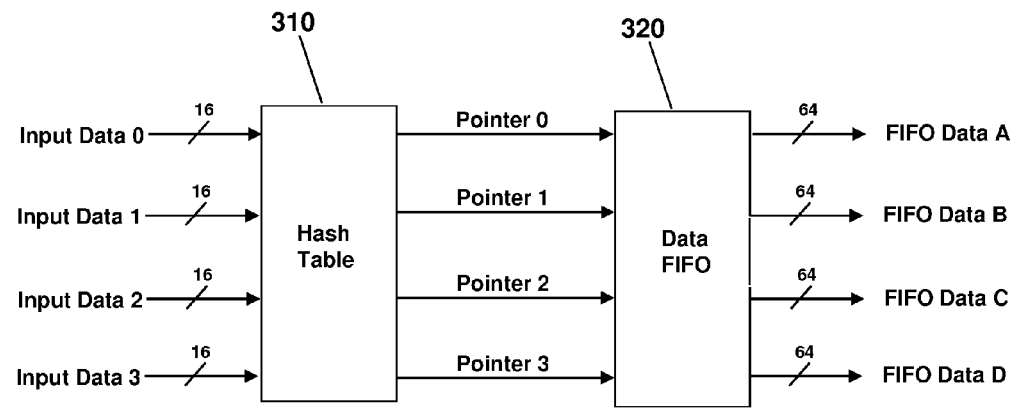
FIG. 3 is an illustration that shows an exemplary doubleword comparison.
Figure 3:
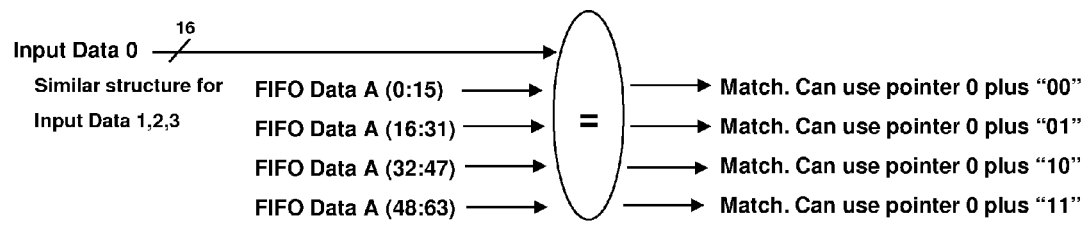
Figure 4:
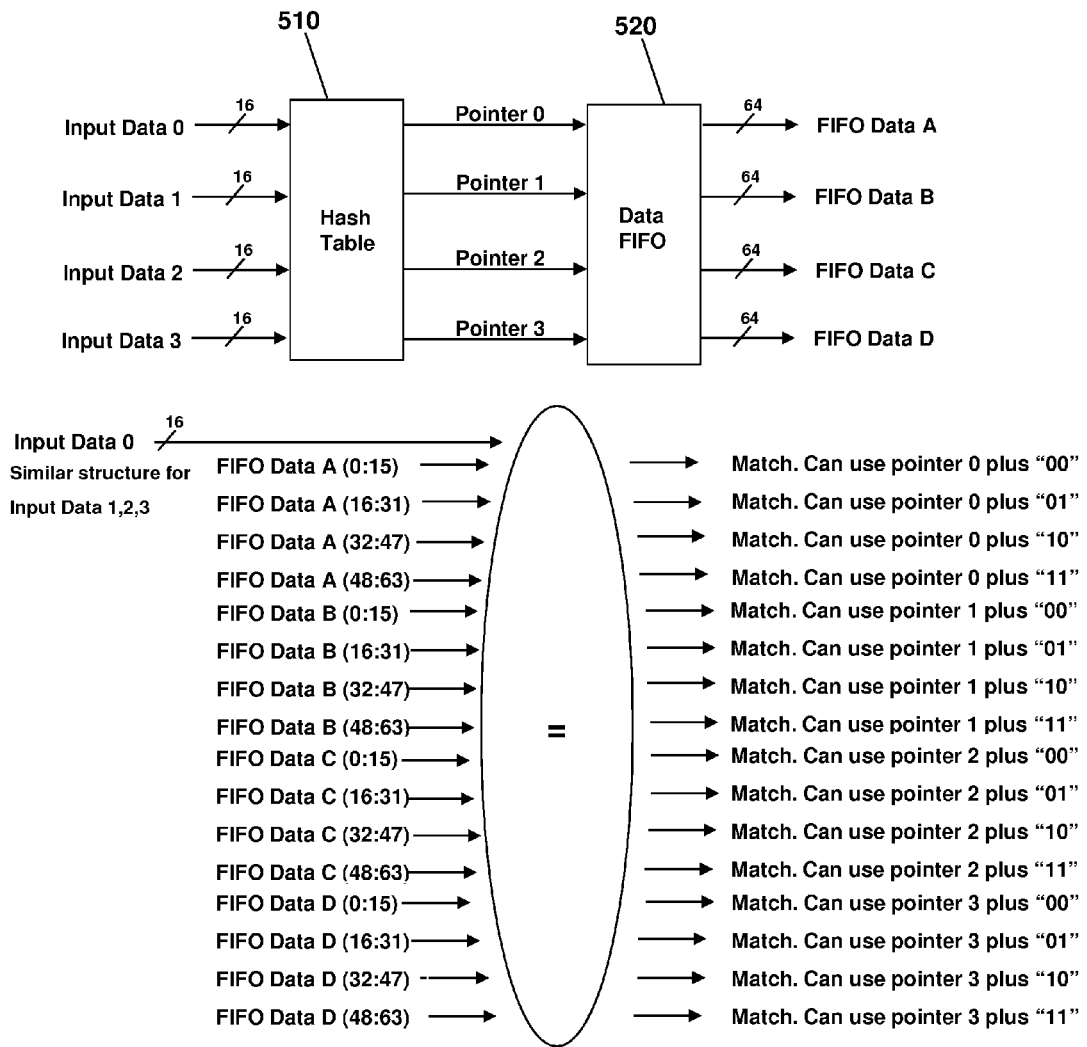
FIG. 4 is an illustration that shows an exemplary all to all comparison.

FIG. 2b shows an exemplary flow for performing aspects of the present invention. The steps of FIG. 2b may be implemented in the environment of FIG. 1, for example. It should be understood that the illustrative process flow of FIG. 2b can be implemented with any of the exemplary aspects of the present invention shown in FIGS. 2a, 3 and 4. For example, FIG. 2a is an illustration that shows an exemplary single comparison, FIG. 3 is an illustration that shows an exemplary doubleword comparison, and FIG. 4 is an illustration that shows an exemplary all to all comparison.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

Referring to both FIGS. 2a and 2b, each block of data may be broken into smaller chunks of data and compared to a history buffer using a single comparison to detect repeating data patterns. For example, at step 210, the comparison tool 100 (as discussed above with respect to FIG. 1) may receive an input of data. For example, the comparison tool 100 may receive a 64 bit input of data (e.g., a doubleword). At step 215, the input data is broken down into smaller pieces of input data. For example, the 64 bit input data may be broken down into four 16 bit pieces of input data (e.g., halfwords) comprising Input Data 0, Input Data 1, Input Data 2, and Input Data 3.

At step 220, each piece of input data is hashed to create a hash table address for each piece of input data. For example, in FIG. 2a, the comparison tool 100 may hash each of the Input Data 0, Input Data 1, Input Data 2, and Input Data 3 using exclusive or (XOR) logic to create a hash table address for each piece of input data in hash table 110. At step 225, the hash table 110 is read to retrieve a pointer or token for each hash table address created for each piece of input data. For example, Pointer 0, Pointer 1, Pointer 2, and Pointer 3 in the hash table 110 may be retrieved respectively for Input Data 0, Input Data 1, Input Data 2, and Input Data 3. The retrieved pointers may point to data within a library buffer, e.g., memory 22A and/or storage system 22B of FIG. 1. The library buffer may comprise a data FIFO table 120 (e.g., a data array or dictionary), which is a history of the input data stream (e.g., previous input data).

At step 230, the data FIFO table 120 is read using the retrieved pointers to obtain corresponding previous input data, and the retrieved previous input data is compared to the newly received input data. For example, the data FIFO table 120 is read using Pointer 0 to find corresponding FIFO data A, and the FIFO data A is compared to the Input Data 0. If the received input data matches the retrieved data from the data FIFO table 120, then the corresponding pointer may be used as a substitute or representation for the received input data. For example, as shown in FIG. 2a, if the Input Data 0 matches the FIFO data A, then the Pointer 0 may be used in a data transmission as a substitute for the Input Data 0. If the new input data does not match the retrieved data from the data FIFO table 120, then the new input data is used in the data transmission. For example, as shown in FIG. 2a, if the Input Data 0 does not match the FIFO data A, then the Input Data 0 is used in the data transmission. Similar processes as described above may be used for Input Data 1, Input Data 2, Input Data 3, and any subsequent new input data received, as illustrated in FIG. 2a.

It should be understood that for the most part any run for detecting repeating data patterns utilizing the processes of steps 210-230 could result in retrieving pointers that point to "dummy data" within the data FIFO table 120. The "dummy data" being data within the data FIFO table 120 that does not necessarily correspond with a current process for detecting repeating data patterns. For example, an initial run for detecting repeating data patterns in a data transmission utilizing the processes of steps 210-230 will result in retrieving pointers that point to "dummy data" within the data FIFO table 120 because none of the input data received for the current data transmission has been written to the data FIFO table 120.

Further, any subsequent run may also result in retrieving pointers that point to "dummy data" within the data FIFO table 120 until the FIFO table 120 is full with the current data transmission.

Advantageously, each pointer or token may have a data size value that is smaller than the input data corresponding with the pointer. For example, Input Data 0 is 16 bits and may have a hash table address, in the hash table 110, with a corresponding pointer that is 6 bits. Thus, the use of the 6 bit pointer to represent the 16 bit data in the data transmission may yield a data compression of about 10 bits. In embodiments, the pointer may comprise a header, e.g., a 4 bit string of data, that identifies the pointer.

At step 235, each piece of newly received input data is written into the library buffer as a part of the input data stream. For example, the Input Data 0, Input Data 1, Input Data 2, and Input Data 3 may be written into a next location of the data FIFO table 120. In embodiments, the data FIFO 120 may keep track of each piece of input data sequentially.

At step 240, the pointers or tokens in the hash table 110 corresponding with each hash table address are updated to point to each piece of newly received input data written into the data FIFO table 120. For example, the Pointer 0, Pointer 1, Pointer 2, and Pointer 3 in the hash table 110 will be updated to point to the locations previously written respectively with Input Data 0, Input Data 1, Input Data 2, and Input Data 3 in the data FIFO 120, at step 235.

In embodiments, at step 245, there is a determination made as to whether any new input data is received subsequent to the received input data. For example, a determination is made as to whether a new 64 bit input data is received subsequent to the received 64 bit input data. If no new input data is determined to be received, then the process ends at step 245. If new input data is determined to be received, then the process continues at step 210.

Referring to FIGS. 2b and 3, each block of data may be broken into smaller chunks of data and compared to the history buffer using doubleword compares to detect repeating data patterns. For example, as discussed above with respect to FIG. 2b, at step 210, the comparison tool 100 (as discussed above with respect to FIG. 1) may receive an input of data. For example, as shown in FIG. 3, the comparison tool 100 may receive a 64 bit input of data. At step 215, the input data is broken down into smaller pieces of input data. For example, the 64 bit input data may be broken down into four 16 bit pieces of input data comprising Input Data 0, Input Data 1, Input Data 2, and Input Data 3.

At step 220, each piece of input data is hashed to create a hash table address for each piece of input data. For example, in FIG. 3, the comparison tool 100 may hash the four 16 bit pieces of input data comprising Input Data 0, Input Data 1, Input Data 2, and Input Data 3 using XOR logic to create a hash table address for each piece of initial input data in hash table 310. At step 225, the hash table 310 is read to retrieve a pointer or token for each hash table address created for each piece of input data. For example, Pointer 0, Pointer 1, Pointer 2, and Pointer 3 in the hash table 310 may be retrieved respectively for Input Data 0, Input Data 1, Input Data 2, and Input Data 3. The retrieved pointers may point to data within the data FIFO table 320 comprising previous input data.

At step 230, the data FIFO table 320 is read using the retrieved pointers to obtain corresponding previous input data, and the retrieved previous input data is compared to the newly received input data. For example, in FIG. 3, the data FIFO table 320 is read using Pointer 0 to find corresponding 64 bit FIFO data A, and each piece of FIFO data A (e.g., FIFO data A (0:15), FIFO data A (16:31), FIFO data A (32:47), and FIFO data A (48:63)) is compared to the Input Data 0. If the new input data matches the retrieved data from the data FIFO 320, then the corresponding pointer may be used as a substitute or representation for the new input data. For example, if the Input Data 0 matches any piece of FIFO data A, then the Pointer 0 may be used in the data transmission as a substitute for the Input Data 0.

In embodiments, concatenated pointers may be used based on the matching of the input data to the individual pieces of FIFO data. For example, if the Input Data 0 matches FIFO data A (16:31), then the Pointer 0, plus the offset 1, may be used in the data transmission as a substitute for the Input Data 0. If the new input data does not match the retrieved data from the data FIFO table 320, then the new input data is used in the data transmission. For example, if the Input Data 0 does not match any piece of the 64 bit of FIFO data A, then the Input Data 0 is used in the data transmission. Similar processes as described above may be used for Input Data 1, Input Data 2, Input Data 3, and any subsequent new data received, as illustrated in FIG. 3.

It should be understood that for the most part any run for detecting repeating data patterns utilizing the processes of steps 210-230 could result in retrieving pointers that point to "dummy data" within the data FIFO table 320. The "dummy data" being data within the data FIFO table 320 that does not necessarily correspond with a current process for detecting repeating data patterns.

Advantageously, each pointer or token may have a data size value that is smaller than the input data corresponding with the pointer. For example, Input Data 0 is 16 bits and may have a hash table address, in the hash table 310, with a corresponding pointer that is 6 bits. Thus, the use of the 6 bit pointer to represent the 16 bit data in the data transmission may yield a data compression of about 10 bits. In embodiments, the pointer may comprise a header, e.g., a 4 bit string of data, that identifies the pointer.

At step 235, each piece of newly received input data is written into the library buffer as a part of the input data stream. For example, the individual 16 bit pieces of input data including Input Data 0, Input Data 1, Input Data 2, and Input Data 3 may be written into a next location of the data FIFO table 320. In embodiments, the data FIFO 320 may keep track of each piece of input data sequentially.

At step 240, pointers or tokens in the hash table 310 corresponding with each hash table address are updated to point to each piece of newly received input data written into the data FIFO table 320. For example, the Pointer 0, Pointer 1, Pointer 2, and Pointer 3 in the hash table 110 will be updated to point to the locations previously written respectively with Input Data 0, Input Data 1, Input Data 2, and Input Data 3 in the data FIFO 120, at step 235.

In embodiments, at step 245, there is a determination made as to whether any new input data is received subsequent to the received input data. For example, a determination is made as to whether a new 64 bit input data is received subsequent to the received 64 bit input data. If no new input data is determined to be received, then the process ends at step 245. If new input data is determined to be received, then the process continues at step 210.

Referring to FIGS. 2b and 4, each block of data may be broken into smaller chunks of data and compared to a history buffer using an all to all compares to detect repeating data patterns. For example, as discussed above with respect to FIG. 2b, at step 210, the comparison tool 100 (as discussed above with respect to FIG. 1) may receive an input of data. For example, the comparison tool 100 may receive a 64 bit input of data. At step 215, the input data is broken down into smaller pieces of input data. For example, the 64 bit input data may be broken down into four 16 bit pieces of input data comprising Input Data 0, Input Data 1, Input Data 2, and Input Data 3.

At step 220, each piece of input data is hashed to create a hash table address for each piece of input data. For example, in FIG. 4, the comparison tool 100 may hash the four 16 bit pieces of input data comprising Input Data 0, Input Data 1, Input Data 2, and Input Data 3 using XOR logic to create a hash table address for each piece of initial input data in hash table 510. At step 225, the hash table 510 is read to retrieve a pointer or token for each hash table address created for each piece of input data. For example, Pointer 0, Pointer 1, Pointer 2, and Pointer 3 in the hash table 510 may be retrieved respectively for Input Data 0, Input Data 1, Input Data 2, and Input Data 3. The retrieved pointers may point to data within the data FIFO table 520 comprising previous input data.

At step 230, the data FIFO table 320 is read using the retrieved pointers to obtain corresponding previous input data, and the retrieved previous input data is compared to the newly received input data. For example, in FIG. 4, the data FIFO table 520 is read using Pointer 0 to find corresponding 64 bit FIFO data A, and each piece of FIFO data A (e.g., FIFO data A (0:15), FIFO data A (16:31), FIFO data A (32:47), and FIFO data A (48:63) is compared to the Input Data 0. Additionally, Input Data 0 may be compared to all of the remaining input data in the data FIFO table 520 including FIFO data B, FIFO data C, and FIFO data D including each piece of FIFO data B, FIFO data C, and FIFO data D (e.g., FIFO data B (0:15), FIFO data B (16:31), FIFO data B (32:47), and FIFO data B (48:63); FIFO data C (0:15), FIFO data C (16:31), FIFO data C (32:47), and FIFO data C (48:63); and FIFO data D (0:15), FIFO data D (16:31), FIFO data D (32:47), and FIFO data D (48:63)).

If the new input data matches any of the data in the data FIFO table 520, then the corresponding pointer may be used as a substitute or representation for the new input data. For example, in FIG. 4, if the Input Data 0 matches any piece of FIFO data A, FIFO data B, FIFO data C, or FIFO data D, then the corresponding Pointer 0, Pointer 1, Pointer 2, or Pointer 3 may be used in a data transmission as a substitute for the Input Data 0.

In embodiments, concatenated pointers may be used based on the matching of the input data to the individual pieces of FIFO data. For example, if the Input Data 0 matches FIFO data B (48:63), then the Pointer 1, plus the offset 3, may be used in the data transmission as a substitute for the Input Data 0. If the new input data does not match the data in the data FIFO table 520, then the new input data is used in the data transmission. For example, if the Input Data 0 does not match any piece of data within the data FIFO table 520, then the Input Data 0 is used in the data transmission. Similar processes as described above may be used for Input Data 1, Input Data 2, Input Data 3, and any subsequent new data received, as illustrated in FIG. 4.

It should be understood that for the most part any run for detecting repeating data patterns utilizing the processes of steps 210-230 could result in retrieving pointers that point to "dummy data" within the data FIFO table 520. The "dummy data" being data within the data FIFO table 520 that does not necessarily correspond with a current process for detecting repeating data patterns.

Advantageously, each pointer or token may have a data size value that is smaller than the input data corresponding with the pointer. For example, Input Data 0 is 16 bits and may have a hash table address, in the hash table 510, with a corresponding pointer that is 6 bits. Thus, the use of the 6 bit pointer to represent the 16 bit data in the data transmission may yield a data compression of about 10 bits. In embodiments, the pointer may comprise a header, e.g., a 4 bit string of data, that identifies the pointer.

At step 235, each piece of newly received input data is written into the library buffer as a part of the input data stream. For example, the individual 16 bit pieces of input data including Input Data 0, Input Data 1, Input Data 2, and Input Data 3 may be written into a next location of the data FIFO table 520. In embodiments, the data FIFO table 520 may keep track of each piece of input data sequentially.

At step 240, pointers or tokens in the hash table 510 corresponding with each hash table address are updated to point to each piece of newly received input data written into the data FIFO table 520. For example, the Pointer 0, Pointer 1, Pointer 2, and Pointer 3 in the hash table 510 will be updated to point to the locations previously written respectively with Input Data 0, Input Data 1, Input Data 2, and Input Data 3 in the data FIFO table 520, at step 235.

In embodiments, at step 245, there is a determination made as to whether any new input data is received subsequent to the received input data. For example, in FIG. 4, a determination is made as to whether a new 64 bit input data is received subsequent to the received 64 bit input data. If no new input data is determined to be received, then the process ends at step 245. If new input data is determined to be received, then the process continues at step 210.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
receiving a plurality of subpieces of input data;
generating a hash table address for each subpiece of the input data;
obtaining a pointer associated with the hash table address for each subpiece of the input data;
reading a data library with the pointer to obtain a location of the data library referenced by each pointer obtained for each subpiece of the input data;
retrieving an associated piece of historical data located at each location of the data library referenced by each pointer; and
comparing each associated piece of the historical data to each subpiece of the input data to determine a match,
wherein at least the step of comparing is performed using a processor.

2. The method of claim 1, further comprising:
writing each subpiece of the input data to a location within the data library; and
updating the hash table such that each pointer is associated with the location of each subpiece of the input data within the data library.

3. The method of claim 2, further comprising breaking the input data down into the plurality of subpieces.

4. The method of claim 1, wherein the pointer points to the location within the data library that comprises the historical data.

5. The method of claim 4, further comprising:
concatenating the pointer into a plurality of pointers that each point respectively to a plurality of subpieces of historical data; and
comparing the plurality of subpieces of historical data to the input data to determine a match.

6. The method of claim 5, wherein when the input data matches at least one subpiece of the plurality of subpieces of historical data, determining the respective concatenated pointer for the at least one subpiece.

7. The method claim 6, further comprising substituting the respective concatenated pointer for the input data in a data transmission.

8. A method comprising:
receiving input data of a first data size, which comprises a plurality of subpieces;
generating a hash table comprising a hash table address for each subpiece of the input data;
writing the input data to a buffer;
receiving subsequent input data of a second size, which comprises a plurality of subpieces;
generating a hash table address for each subpiece of the subsequent input data;
retrieving a number of buffer addresses referenced by each hash table address for each subpiece of the subsequent input data;
retrieving data written to the buffer referenced by each retrieved buffer addresses, wherein the retrieved data comprises the plurality of subpieces of the input data; and
comparing the subsequent input data to the plurality of subpieces of the input data and any historical data in the buffer to find a match,
wherein at least the step of comparing is performed using a processor.

9. The method of claim 8, further comprising:
reading the hash table to obtain the hash table address for the input data; and
breaking the input data down into the plurality of subpieces, wherein the plurality of subpieces are the second size.

10. The method of claim 9, wherein the hash table address is associated with a pointer that points to the input data in the buffer.

11. The method of claim 10, further comprising concatenating the pointer into a plurality of pointers that each point respectively to the plurality of subpieces of the input data.

12. The method of claim 11, wherein, when the subsequent input data matches at least one subpiece of the plurality of subpieces, determining the respective concatenated pointer for the at least one subpiece.

13. The method claim 12, further comprising substituting the respective concatenated pointer for the subsequent input data in a data transmission.

14. The method of claim 8, wherein the historical data comprises previously received input data of the first data size, the previously received input data comprising another plurality of subpieces of input data.

15. The method of claim 14, wherein, when the subsequent input data matches at least one subpiece of the another plurality of subpieces, determining a respective concatenated pointer for the at least one subpiece of the another plurality of subpieces.

16. The method claim 15, further comprising substituting the respective concatenated pointer for the subsequent input data in a data transmission.

17. A computer program product comprising a computer usable storage memory having readable program code embodied in the storage memory, the computer program product includes at least one component operable to:
receive "n" number of input words;
use a hash function to obtain a hash table address for each of the "n" number of input words;
retrieve "n" number of FIFO addresses referenced by each hash table address for each of the "n" number of input words;
retrieve "n" number of FIFO words referenced by each of the "n" number of FIFO addresses; and
compare each of the "n" number of input words with the "n" number of FIFO words.

18. The computer program product of claim 17, wherein each FIFO word of the "n" number of FIFO words is comprised of "z" number of subwords; and the comparing comprises comparing each of the "n" number of input words with all of the "z" number of subwords comprised within the "n" number of FIFO words.

19. The computer program product of claim 18, wherein each input word of the "n" number of input words is "x" bits long and each subword of the "z" number of subwords is "x" bits long.

20. The computer program product of claim 19, further comprising returning each of the corresponding FIFO addresses for each match between the "n" number of input words and the "z" number of subwords comprised within the "n" number of FIFO words.

* * * * *